United States Patent
Aigner et al.

(10) Patent No.: US 12,301,211 B2
(45) Date of Patent: May 13, 2025

(54) MICROACOUSTIC FILTER WITH A CAVITY STACK

(71) Applicant: RF360 Singapore Pte. Ltd., Republic Plaza (SG)

(72) Inventors: Willi Aigner, Moosinning (DE); Benno Blaschke, Munich (DE); Christian Ceranski, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 223 days.

(21) Appl. No.: 17/930,791

(22) Filed: Sep. 9, 2022

(65) Prior Publication Data

US 2024/0088871 A1    Mar. 14, 2024

(51) Int. Cl.
*H03H 9/54* (2006.01)
*H03H 9/46* (2006.01)

(52) U.S. Cl.
CPC .............. *H03H 9/542* (2013.01); *H03H 9/46* (2013.01)

(58) Field of Classification Search
CPC ................................. H03H 9/542; H03H 9/46
USPC ............................................. 333/186.19, 193
See application file for complete search history.

(56) References Cited

U.S. PATENT DOCUMENTS

| | | | |
|---|---|---|---|
| 10,491,192 B1 | 11/2019 | Plesski et al. | |
| 2005/0255234 A1* | 11/2005 | Kanda | H03H 9/175 29/25.35 |
| 2008/0067896 A1 | 3/2008 | Inoue et al. | |
| 2013/0109332 A1* | 5/2013 | Aigner | H03H 9/568 333/186 |
| 2013/0235001 A1 | 9/2013 | Yun et al. | |
| 2013/0241673 A1 | 9/2013 | Yokoyama et al. | |
| 2014/0167881 A1 | 6/2014 | Iwasaki et al. | |
| 2015/0303371 A1 | 10/2015 | Ueno et al. | |
| 2015/0349747 A1 | 12/2015 | Burak et al. | |
| 2016/0087186 A1 | 3/2016 | Burak | |
| 2017/0288629 A1 | 10/2017 | Bhattacharjee et al. | |
| 2018/0212589 A1* | 7/2018 | Meltaus | H03H 9/547 |

(Continued)

FOREIGN PATENT DOCUMENTS

| | | |
|---|---|---|
| CN | 107244645 A | 10/2017 |
| CN | 113904562 A | 1/2022 |

(Continued)

OTHER PUBLICATIONS

Morgan., "Surface Acoustic Wave Filters", Chapter 3—Electrical Excitation at a Plane Surface, Jan. 2007, pp. 82-86.

(Continued)

*Primary Examiner* — Rakesh B Patel
(74) *Attorney, Agent, or Firm* — Polsinelli

(57) ABSTRACT

An apparatus is disclosed for implementing a microacoustic filter with a cavity stack. In an example aspect, the apparatus includes a microacoustic filter with an electrode structure, a cavity stack, a buffer layer, and a piezoelectric layer. The cavity stack comprises a conductive layer, a substrate layer, and at least two pillars extending past a plane defined by a surface of the substrate layer and towards the conductive layer to form a cavity between the substrate layer and the conductive layer. The buffer layer is disposed between the conductive layer of the cavity stack and the electrode structure. The piezoelectric layer is disposed between the buffer layer and the electrode structure.

25 Claims, 6 Drawing Sheets

(56) References Cited

U.S. PATENT DOCUMENTS

| | | | |
|---|---|---|---|
| 2019/0028081 A1* | 1/2019 | Pelzel | H03H 3/08 |
| 2019/0212300 A1* | 7/2019 | Cole | G01N 29/022 |
| 2019/0348966 A1 | 11/2019 | Campanella-Pineda et al. | |
| 2020/0259480 A1 | 8/2020 | Pensala et al. | |
| 2021/0028762 A1 | 1/2021 | Kay et al. | |
| 2021/0119606 A1* | 4/2021 | Lu | H03H 9/02559 |
| 2021/0194453 A1 | 6/2021 | Plesski | |
| 2021/0257990 A1 | 8/2021 | Turner | |
| 2022/0231658 A1 | 7/2022 | McHugh | |
| 2022/0311409 A1 | 9/2022 | Geselbracht et al. | |
| 2022/0416149 A1* | 12/2022 | Hou | H03H 9/02031 |
| 2023/0105560 A1 | 4/2023 | Shin et al. | |
| 2023/0107820 A1 | 4/2023 | Fukuhara et al. | |
| 2023/0268907 A1 | 8/2023 | Blaschke et al. | |
| 2023/0361757 A1 | 11/2023 | Blaschke et al. | |

FOREIGN PATENT DOCUMENTS

| | | |
|---|---|---|
| CN | 113904652 A | 1/2022 |
| CN | 115800950 A | 3/2023 |
| EP | 0602666 A1 | 6/1994 |
| JP | H036912 A | 1/1991 |
| WO | 2005112258 A1 | 11/2005 |
| WO | 2022019170 A1 | 1/2022 |
| WO | 2023035400 A1 | 3/2023 |

OTHER PUBLICATIONS

Plessky V., et al., "5 GHZ Laterally-Excited Bulk-Wave Resonators (XBARs) based on Thin Platelets of Lithium Niobate," Electronics Letters, Nov. 2018, vol. 55, No. 2, 3 pages.

Plessky V., et al., "Excitation of SAW Resonators and BAW-Overmoded Resonators by Suspended IDT", 2014 European Frequency and Time Forum (EFTF), IEEE, Jun. 2014, pp. 40-43.

Plessky V., et al., "XBAR" Oct. 2022. 11 pages.

Partial International Search Report—PCT/SG2023/050559—ISA/EPO—Nov. 28, 2023, 11 pages.

International Search Report and Written Opinion—PCT/SG2023/050559—ISA/EPO—Mar. 19, 2024, 21 pages.

Su J., et al., "Growth of Highly c-Axis Oriented AlScN Films on Commercial Substrates", Micromachines, vol. 13, No. 5, May 17, 2022, pp. 1-9, XP093135595, Figures 3, 4, 5.

* cited by examiner

600

Provide a cavity stack comprising a conductive layer, a substrate layer, and at least two pillars extending past a plane defined by a surface of the substrate layer and towards the conductive layer to form a cavity between the substrate layer and the conductive layer
602

↓

Dispose a buffer layer on a surface of the conductive layer
604

↓

Dispose a piezoelectric layer on a surface of the buffer layer using epitaxy
606

FIG. 6

MICROACOUSTIC FILTER WITH A CAVITY STACK

TECHNICAL FIELD

This disclosure relates generally to wireless transceivers and other components that employ filters and, more specifically, to a microacoustic filter implemented with a cavity stack.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for radio-frequency applications, including those that utilize frequencies below 2.6 gigahertz (GHz).

SUMMARY

An apparatus is disclosed that implements a microacoustic filter with a cavity stack using a piezoelectric material that excites a plate mode. In example implementations, the microacoustic filter includes the piezoelectric layer (e.g., formed using aluminium scandium nitride), a cavity stack, and a buffer layer disposed between the cavity stack and the piezoelectric layer. The piezoelectric material has a crystal orientation that enables excitation of a plate mode (e.g., a Lame mode) with an orientation that is normal to a surface of the piezoelectric layer (e.g., with an orientation along a vertical axis). A top layer of the cavity stack and the buffer layer enable epitaxial growth of the piezoelectric layer such as aluminium scandium nitride. This enables the piezoelectric layer such as aluminium scandium nitride to be directly deposited onto the buffer layer and the cavity stack without using a layer-removal process or a transfer process. This manufacturing process enables the microacoustic filter to have a competitive price point compared to surface-acoustic-wave filters that use other piezoelectric materials such as lithium niobate or lithium tantalate piezoelectric material and bulk wafer material, including for wafer sizes that are 150 millimeters in size or more. In contrast to some surface-acoustic-wave filters, the microacoustic filter can also have a higher electromechanical coupling factor and quality factor. This improved performance can be due, at least in part, to the intrinsic confinement of an acoustic wave by a cavity that is present within the cavity stack.

In an example aspect, an apparatus for filtering is disclosed. The apparatus includes a microacoustic filter with an electrode structure, a cavity stack, a buffer layer, and a piezoelectric layer. The cavity stack comprises a conductive layer, a substrate layer, and at least two pillars extending past a plane defined by a surface of the substrate layer and towards the conductive layer to form a cavity between the substrate layer and the conductive layer. The buffer layer is disposed between the conductive layer of the cavity stack and the electrode structure. The piezoelectric layer is disposed between the buffer layer and the electrode structure.

In an example aspect, an apparatus for filtering is disclosed. The apparatus includes a microacoustic filter configured to generate a filtered signal from a radio-frequency signal. The microacoustic filter includes means for converting the radio-frequency signal to an acoustic wave and converting a formed acoustic wave into the filtered signal. The microacoustic filter also includes means for exciting a plate mode using a piezoelectric layer to produce the formed acoustic wave. The microacoustic filter additionally includes means for enabling epitaxial growth of the piezoelectric layer. The microacoustic filter further includes means for confining energy of the plate mode within the means for exciting the plate mode and the means for enabling epitaxial growth.

In an example aspect, a method for manufacturing a microacoustic filter is disclosed. The method includes providing a cavity stack comprising a conductive layer, a substrate layer, and at least two pillars extending past a plane defined by a surface of the substrate layer and towards the conductive layer to form a cavity between the substrate layer and the conductive layer. The method also includes disposing a buffer layer on a surface of the conductive layer using epitaxy. The method further includes disposing a piezoelectric layer on a surface of the buffer layer.

In an example aspect, a piezoelectric apparatus is disclosed. The piezoelectric apparatus includes an electrode structure, a buffer layer, and a piezoelectric layer. The buffer layer is configured to enable epitaxial growth of aluminium scandium nitride (AlScN). The piezoelectric layer is disposed between the buffer layer and the electrode structure. The piezoelectric layer comprises the aluminium scandium nitride (AlScN) having a crystal-axis orientation that is approximately normal to a planar surface of the piezoelectric layer.

BRIEF DESCRIPTION OF DRAWINGS

FIG. 6 is a flow diagram illustrating an example process for manufacturing a microacoustic filter with a cavity stack.

DETAILED DESCRIPTION

Figure 1:
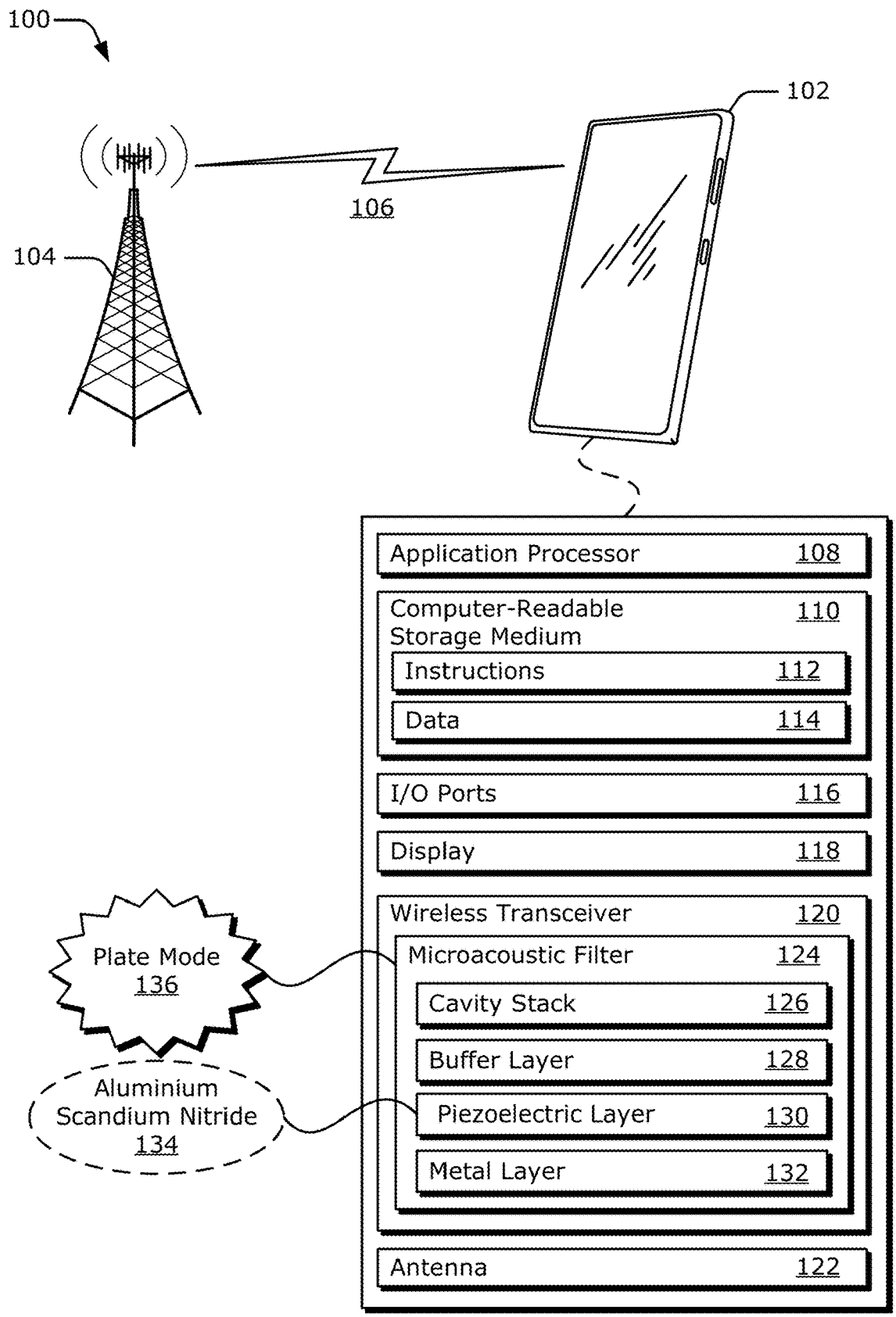
FIG. 1 illustrates an example operating environment for a microacoustic filter with a cavity stack.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using a piezoelectric material, the acoustic filter operates by transforming an electrical signal wave that is applied to an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electromagnetic and acoustic waves.

The acoustic wave features a velocity having a magnitude that is significantly less than that of a velocity of the electromagnetic wave. Generally, the magnitude of the propagation velocity of a wave is proportional to a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging, however, to design an acoustic filter that supports frequencies between approximately 500 megahertz (MHz) and 2.6 gigahertz (GHz) and is cost competitive. Some surface-acoustic-wave filters can support these frequencies and have a relatively low price point; however, the electromechanical coupling factors and/or quality factors of these filters may not be sufficient for some applications. Many surface-acoustic-wave filters rely on lithium niobate ($LiNbO_3$) or lithium tantalate ($LiTaO_3$) piezoelectric material, which can be purchased as a single-crystal with a variety of possible different crystal orientations. As wafer sizes increase to 150 millimeters (mm) or more, however, these piezoelectric materials can become significantly more expensive or unavailable.

To provide certain cost and performance improvements, techniques for implementing a microacoustic filter with a cavity stack using a piezoelectric material configured to excite a plate mode. In example implementations, a microacoustic filter includes the piezoelectric layer formed (e.g., using aluminium scandium nitride), a cavity stack, and a buffer layer disposed between the cavity stack and the piezoelectric layer. The piezoelectric material has a crystal orientation that enables excitation of a plate mode (e.g., a Lame mode) with an orientation that is normal to a surface of the piezoelectric layer (e.g., with an orientation along a vertical axis). The cavity stack includes a conductive layer, a substrate layer, and at least two pillars that suspend the conductive layer "above" the substrate layer to form a cavity.

The conductive layer and the buffer layer enable epitaxial growth of the piezoelectric material (e.g., such as aluminium scandium nitride). This enables the piezoelectric material to be directly deposited onto the buffer layer and the cavity stack without using a layer-removal process or a transfer process. This manufacturing process enables the microacoustic filter to have a competitive price point compared to surface-acoustic-wave filters that use lithium niobate or lithium tantalate piezoelectric material and bulk wafer material, including for wafer sizes that are 150 mm in size or more.

In contrast to some surface-acoustic-wave filters, the microacoustic filter can have a higher electromechanical coupling factor and quality factor. This improved performance can be due, at least in part, to the intrinsic confinement of an acoustic wave by the cavity that is present within the cavity stack. These techniques can be used with and provide benefits for, for example, microacoustic filters that support frequencies above 500 MHz as well as for other microacoustic filters that support frequencies at or below 2.6 GHz.

FIG. 1 illustrates an example environment 100 for a microacoustic filter having a cavity stack. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth)®; IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one microacoustic filter 124 (e.g., an acoustic filter, a plate-mode acoustic-wave filter, a cavity plate-mode microacoustic filter, or a membrane-type filter). In some implementations, the wireless transceiver 120 includes multiple microacoustic filters 124, which can be formed from microacoustic resonators arranged in series, in parallel, in a ladder structure, in a lattice structure, or some combination thereof. Although the microacoustic filter 124 can be any type of microacoustic filter, the techniques for implementing a microacoustic filter using a particular cavity stack can be particularly cost competitive for wafer sizes that are approximately 150, 200, or 300 mm. In general, the term "approximately" can mean that any of the wafer sizes can be within +/−10% of a specified value or less (e.g., within +/−5%, +/−3%, or +/−2% of a specified value).

The microacoustic filter 124 includes at least one cavity stack 126, at least one buffer layer 128, at least one piezoelectric layer 130, and at least one metal layer 132. In some embodiments, the piezoelectric layer 130 is formed using aluminium scandium nitride 134. A crystal orientation of the piezoelectric layer 130 is provided to enable excitation of a main wave mode having an orientation that is normal to a planar surface of the piezoelectric layer 130. An example main wave mode includes a plate mode 136 (e.g., a Lame plate mode). The plate mode 136 excites an acoustic wave that causes different horizontal portions (e.g., a left portion and a right portion) of the piezoelectric layer 130 to move in opposite directions along a vertical axis. The plate mode 136 is a quasi-stationary mode.

The cavity stack 126 and the buffer layer 128 enable or promote epitaxial growth of the piezoelectric layer 130. In particular, when using aluminium scandium nitride 134 (or similar material) a distance between atoms within a membrane layer (or "top" layer) of the cavity stack 126 and atoms within the buffer layer 128 have a relationship that facilitates the epitaxial growth of the aluminium scandium nitride 134.

In general, the buffer layer 128 represents a crystalline seed layer used in epitaxy to enable the deposition of crystalline layers of the aluminium scandium nitride 134.

In some implementations, the cavity stack 126 represents a silicon-on-insulator (SOI) wafer. The cavity stack 126 suspends the buffer layer 128 and the piezoelectric layer 130 to provide isolation or confinement for the plate mode 136. The cavity stack 126 also provides a conductive backside to improve coupling of the electric field between electrode fingers of the metal layer 132. The coupling of the electric field via the conductive backside of the cavity stack 126 and the crystal orientation of the piezoelectric layer 130 enables excitation of the plate mode 136. Both the suspension aspects and resistivity (e.g., conductivity) aspects of the cavity stack 126 enable the microacoustic filter 124 to realize a particular electromechanical coupling factor and/or quality factor.

The metal layer 132 includes an electrode structure (e.g., an electrode structure 302 of FIG. 3) and can be disposed on the piezoelectric layer 130. With the techniques of using aluminium scandium nitride 134, the microacoustic filter 124 can be designed to support frequencies between approximately 500 MHz and 2.6 GHz, including frequencies at approximately 1.5 and 2.5 GHz. Although higher frequencies may be possible. In general, the term "approximately" can mean that any of the frequencies can be within +/−10% of a specified value or less (e.g., within +/−5%, +/−3%, or +/−2% of a specified value). The microacoustic filter 124 is further described with respect to FIG. 2.

Figure 2:
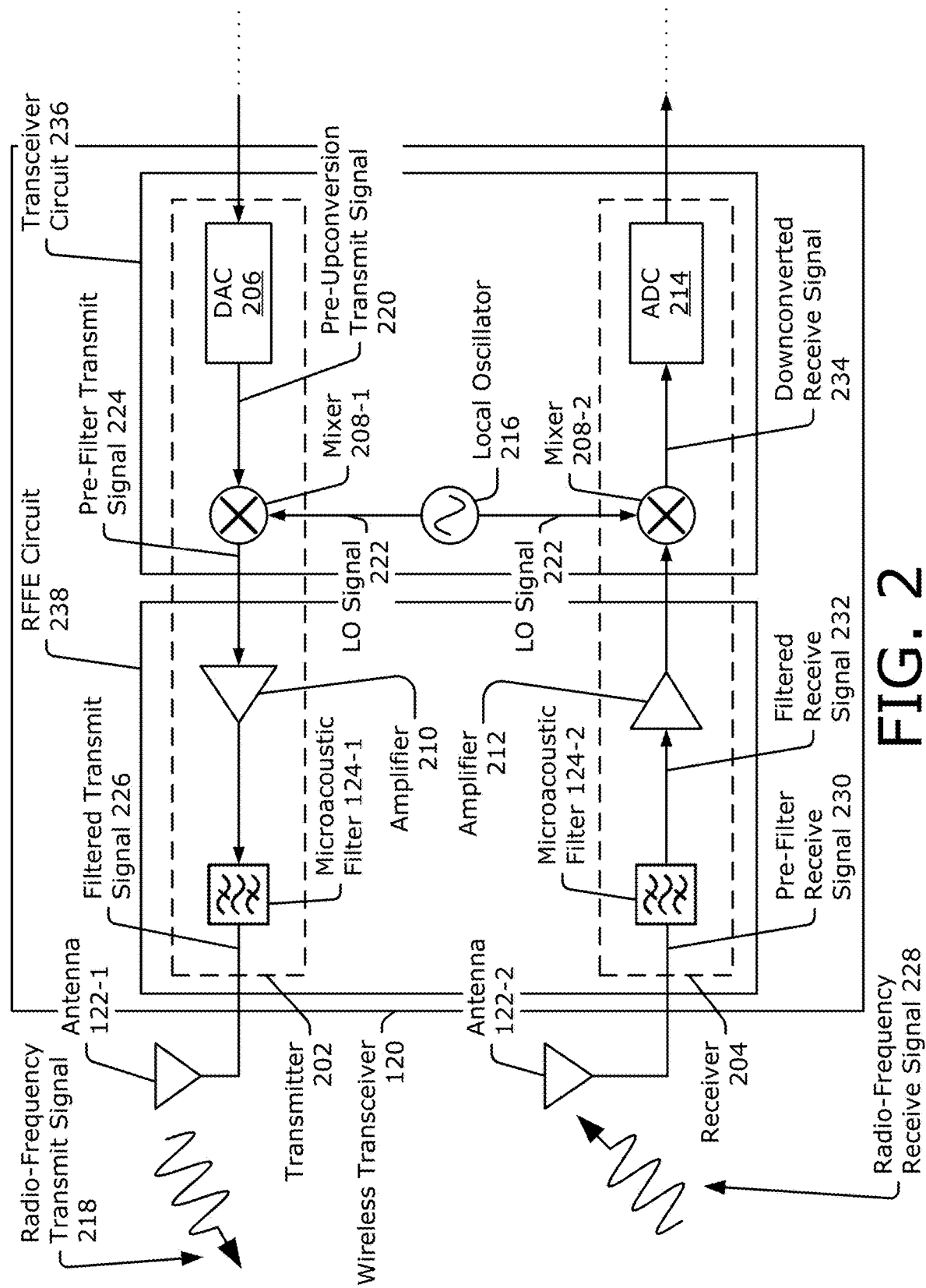
FIG. 2 illustrates an example wireless transceiver including at least one microacoustic filter with a cavity stack.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one first microacoustic filter 124-1. The receiver 204 includes at least one second microacoustic filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the microacoustic filter 124-1 of the transmitter 202, the microacoustic filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an unconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the first microacoustic filter 124-1.

The first microacoustic filter 124-1 filters the amplified pre-filter transmit signal 224 to generate a filtered transmit signal 226. As part of the filtering process, the first microacoustic filter 124-1 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second microacoustic filter 124-2 accepts the received radio-frequency receive signal 228, which is represented by a pre-filter receive signal 230. The second microacoustic filter 124-2 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which microacoustic filters 124 may be included. For example, the microacoustic filters 124 can be integrated within duplexers or diplexers of the wireless transceiver 120. Example implementations of the microacoustic filter 124-1 or 124-2 are further described with respect to FIGS. 3 to 5.

Figure 3:
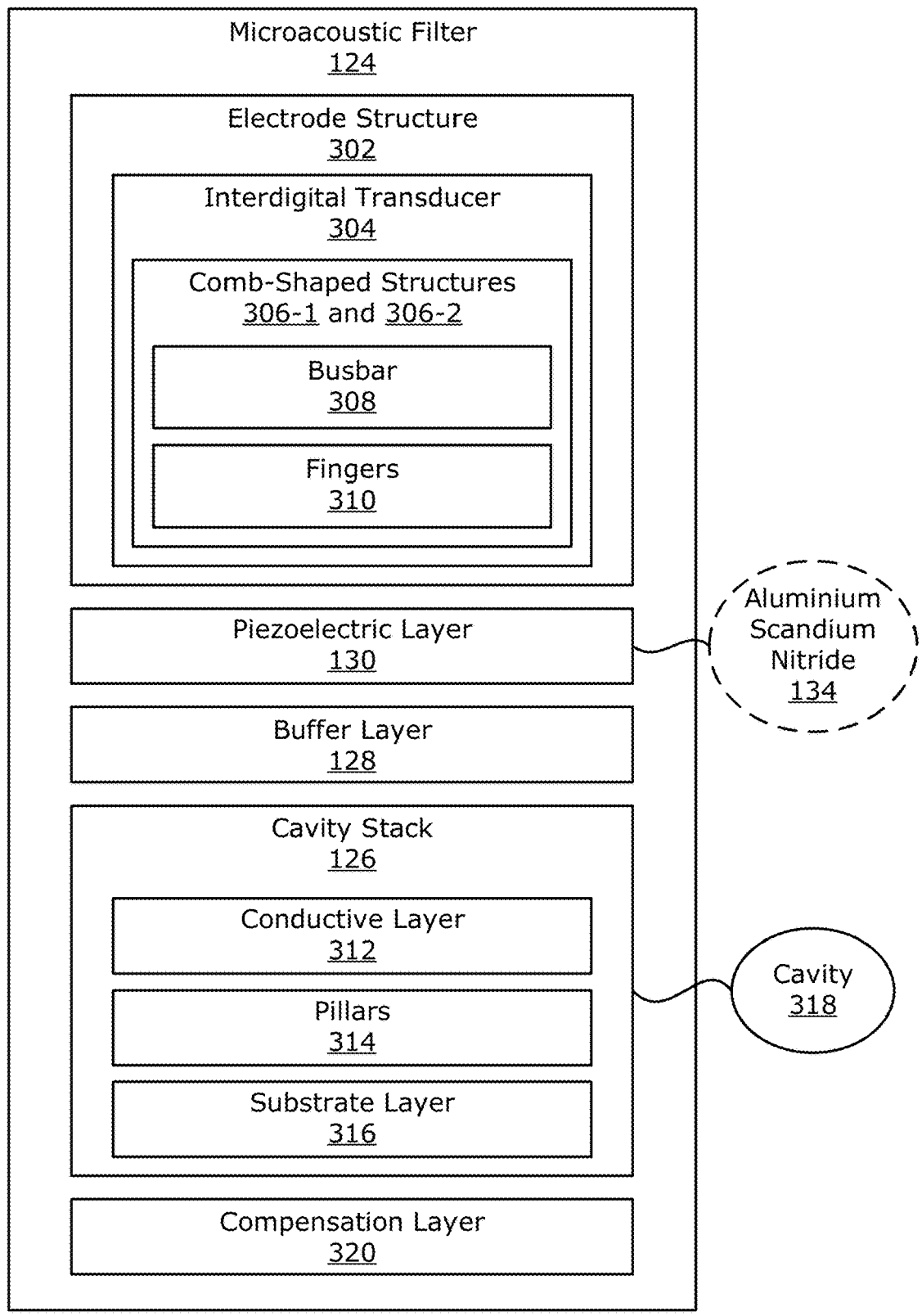
FIG. 3 illustrates example components of a microacoustic filter with a cavity stack.

FIG. 3 illustrates example components of the microacoustic filter 124. In the depicted configuration, the microacoustic filter 124 includes an electrode structure 302, the piezoelectric layer 130, the buffer layer 128, and the cavity stack 126. The electrode structure 302 comprises an electrically conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), or some combination or doped version thereof. The adhesion layers can be composed of chromium (Cr), titanium (Ti), molybdenum (Mo), or some combination thereof.

The electrode structure 302 can include one or more interdigital transducers 304. The interdigital transducer 304 converts an electrical signal into an acoustic wave and converts the acoustic wave into a filtered electrical signal. The interdigital transducer 304 includes at least two comb-shaped structures 306-1 and 306-2. Each comb-shaped structure 306-1 and 306-2 includes a busbar 308 (e.g., a conductive segment or rail) and multiple fingers 310 (e.g., electrode fingers). An example interdigital transducer 304 is further described with respect to FIG. 4. Although not explicitly shown, the electrode structure 302 can also include two or more reflectors. In an example implementation, the interdigital transducer 304 is arranged between two reflectors.

The piezoelectric layer 130 has a crystalline (or crystal) structure defined by an ordered arrangement of particles (e.g., atoms, ions, or molecules). The crystalline structure of the piezoelectric layer 130 is selected such that the piezoelectric layer 130 excites the plate mode 136. In some implementations, aluminum scandium nitride 134 may be used. Some implementations of the aluminium scandium nitride 134 have a ratio of approximately 70 aluminium atoms and 30 scandium atoms to every 100 nitrogen atoms. The addition of the scandium atoms to the aluminium-nitrogen crystal lattice leads to a softening of the aluminium-nitrogen lattice structure, which can increase its piezoelectric coupling and a bandwidth of the microacoustic filter 124. A crystal-axis orientation of the piezoelectric layer 130 is approximately normal to a planar surface of the piezoelectric layer 130.

The buffer layer 128 can be implemented using a variety of different materials. For example, the buffer layer 128 can include at least one of the following types of materials: aluminium (Al), aluminium nitride (AlN), gallium (Ga), gallium nitride (GaN), hafnium (Hf), hafnium nitride (HfN), molybdenum (Mo), molybdenum nitride (MoN), niobium (Nb), niobium nitride (NbN), silicon carbide (SiC), scandium (Sc), scandium nitride (ScN), titanium (Ti), titanium nitride (TiN), zinc (Zn), zinc oxide (ZnO), zirconium (Zr), or zirconium nitride (ZrN), or a combination thereof. In some implementations, the buffer layer 128 can be implemented using a metallic layer.

The cavity stack 126 includes at least one conductive layer 312, at least two pillars 314, and at least one substrate layer 316. The conductive layer 312 acts as a membrane layer of the cavity stack 126 and has a resistivity less than approximately 0.1 ohm centimeter ($\Omega \cdot cm$) (e.g., a conductivity greater than approximately 10 siemens per centimeter (S/cm)). In general, the resistivity of the conductive layer 312 is such that the conductivity between two fingers 310 through the conductive layer 312 is approximately a same order of magnitude as the conductivity along the interdigital transducer 304.

To enable epitaxial growth of the piezoelectric layer 130, the conductive layer 312 may be formed using a single crystal material instead of an amorphous material. In example implementations, the conductive layer 312 includes doped silicon (Si). The doped silicon can have a doping concentration that is greater than approximately $10^{18}$ atoms per cubic centimeter to achieve the target resistivity. In general, a thickness of the conductive layer 312 is sufficient to support suspension of the buffer layer 128, the piezoelectric layer 130, and the electrode structure 302 "above" the substrate layer 316. In terms of Miller indices, the conductive layer 312 can be represented as Si (1 1 1).

The pillars 314 are disposed between the conductive layer 312 and the substrate layer 316. The pillars 314 can be formed using a dielectric material, such as silicon dioxide (SiO$_2$). In general, the pillars 314 provide structural support to elevate the conductive layer 312 "above" the substrate layer 316. By elevating the conductive layer 312, the pillars 314 suspend at least a portion of the piezoelectric layer 130, the buffer layer 128, and the conductive layer 312 apart from the substrate layer 316. The pillars 314 are positioned at different points along an axis that is normal to a longitudinal axis of the fingers 310 of the electrode structure 302. In some aspects, the material of the pillars 314 may be selected (e.g., such as in the case of SiO$_2$) to provide a temperature compensation effect.

The pillars 314 define a cavity 318 (or gap) between the conductive layer 312 and the substrate layer 316. The cavity 318 can include a gas, such as air. The pillars 314 provide stability and support to prevent the cavity 318 from collapsing. In some implementations, the fingers 310 of the interdigital transducer 304 are positioned between the pillars 314 along the axis that is normal to the longitudinal axis of the fingers 310. Any reflectors can also be positioned between the pillars 314 along this axis. In this sense, the cavity 318 can be considered to be "below" the fingers 310 and/or the reflectors. In general, positioning the cavity 318 below a portion of the electrode structure 302 can be advantageous as the acoustic wave (or plate wave) is confined to the piezoelectric layer 130, the buffer layer 128, and the conductive layer 312.

To achieve a resonant frequency between approximately 500 MHz and 2.5 GHz, the piezoelectric layer 130 and the conductive layer 312 can each have a thickness between approximately 0.5 and 5 micrometers (μm). Also, the pitch of the interdigital transducer 304 can be between approximately 500 nanometers (nm) and 5 μm. In some implementations, the thickness of the piezoelectric layer 130 and the thickness of the conductive layer 312 are approximately equal. For example, both the thickness of the piezoelectric layer 130 and the thickness of the conductive layer 312 can be approximately equal to 1000 nm to implement a first microacoustic filter 124 with a resonant frequency of approximately 1.5 GHz. As another example, both the thickness of the piezoelectric layer 130 and the thickness of the conductive layer 312 can be approximately equal to 600 nm to implement a second microacoustic filter 124 with a resonant frequency of approximately 2.6 GHz. In general, the term "approximately" can mean that any of the thicknesses can be within +/−10% of a specified value or less (e.g., within +/−5%, +/−3%, or +/−2% of a specified value). A thickness of the buffer layer 128 can be less than the thickness of the piezoelectric layer 130.

A design of the microacoustic filter 124 can achieve a electromechanical coupling factor (k$^2$) that is greater than 10% (e.g., 10.5%, 11%, 12%, or 15%). In general, the term "approximately" can mean that any of the electromechanical coupling factors can be within +/−10% of a specified value or less (e.g., within +/−5%, +/−3%, or +/−2% of a specified value). One way to define the electromechanical coupling factor is further shown in Equation 1 below:

$$k^2 = \frac{\left(\frac{\pi}{2}\right)^2 \left(\frac{f_s}{f_p}\right)(f_p - f_s)}{f_p} \quad \text{Equation 1}$$

where $f_s$ is the resonance frequency and $f_p$ is the antiresonance frequency. The design of the microacoustic filter 124 can also realize an absolute value of temperature coefficient of frequency (TCF) of approximately 40 parts-per-million/ Kelvin (ppm/K) or less (e.g., the temperature coefficient of frequency is approximately −40 ppm/K or more).

The substrate layer 316 includes one or more sublayers that provide support for the microacoustic filter 124. In one example implementation, the substrate layer 316 is formed using silicon (Si). The substrate layer 316 can represent a wafer.

Figure 5:
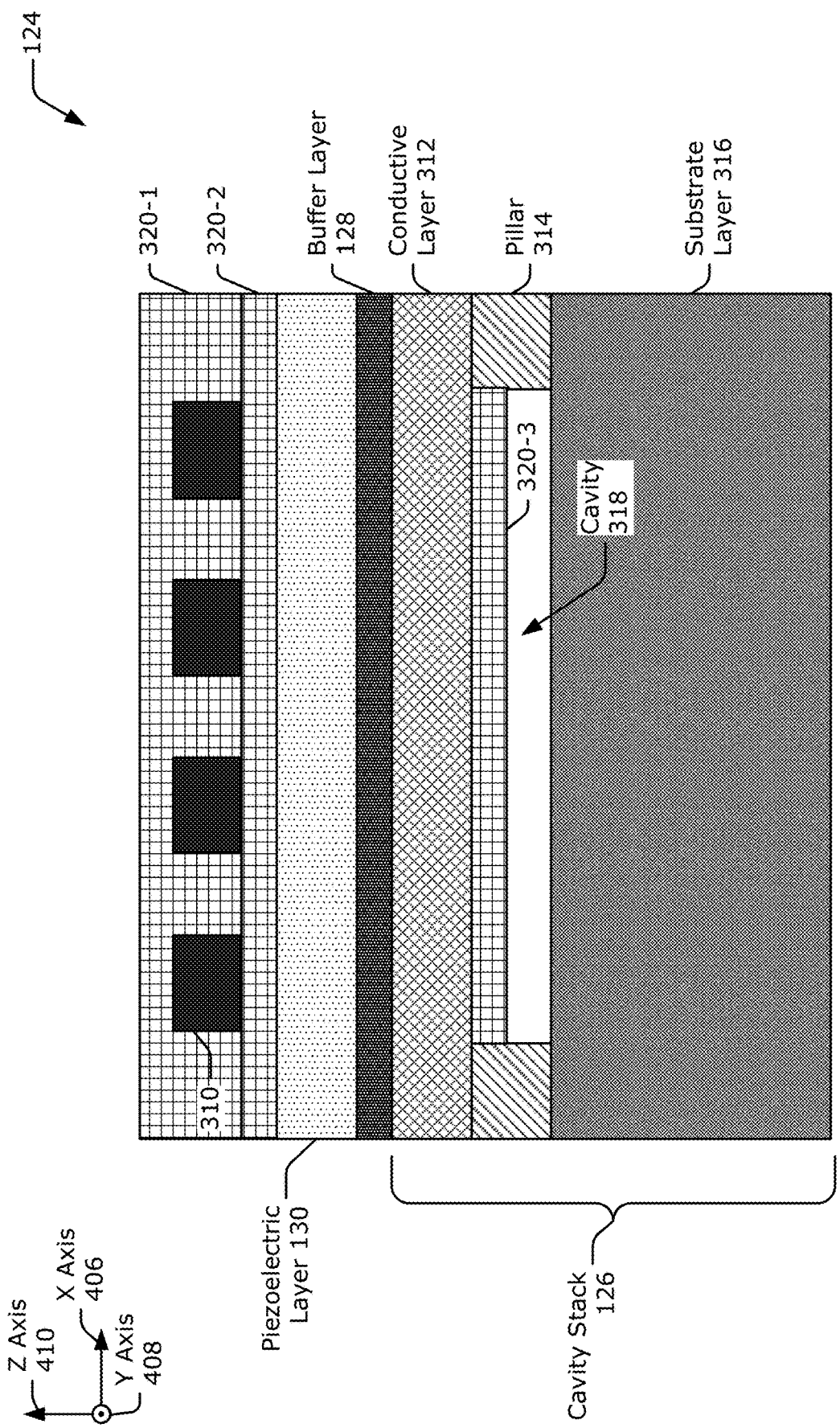
FIG. 5 illustrates example compensation layers of a microacoustic filter with a cavity stack.

In some implementations, the microacoustic filter 124 includes at least one compensation layer 320, such as one or more of the compensation layers 320 shown in FIG. 5. The compensation layer 320 can provide temperature compensation to enable the microacoustic filter 124 to achieve a target temperature coefficient of frequency based on the thickness of the piezoelectric layer 130. In an example implementation, the compensation layer 320 is implemented using silicon dioxide (SiO$_2$). Other example implementations can use other types of material, such as doped silicon dioxide, silicon nitride (SiN), silicon oxynitride (SiON), or fluorine-doped silicon oxide (SiOF). In some applications, the microacoustic filter 124 may not include, for instance, the compensation layer 320 to reduce cost of the microacoustic filter 124.

In some aspects, the microacoustic filter 124 can be considered a resonator. Sometimes the microacoustic filter 124 can be connected to other resonators associated with different layer stacks than the microacoustic filter 124. In other aspects, the microacoustic filter 124 can be implemented as multiple interconnected resonators, which use the same layers (e.g., the buffer layer 128, the piezoelectric layer 130, and/or the conductive layer 312). The microacoustic filter 124 is further described with respect to FIG. 4.

Figure 4:
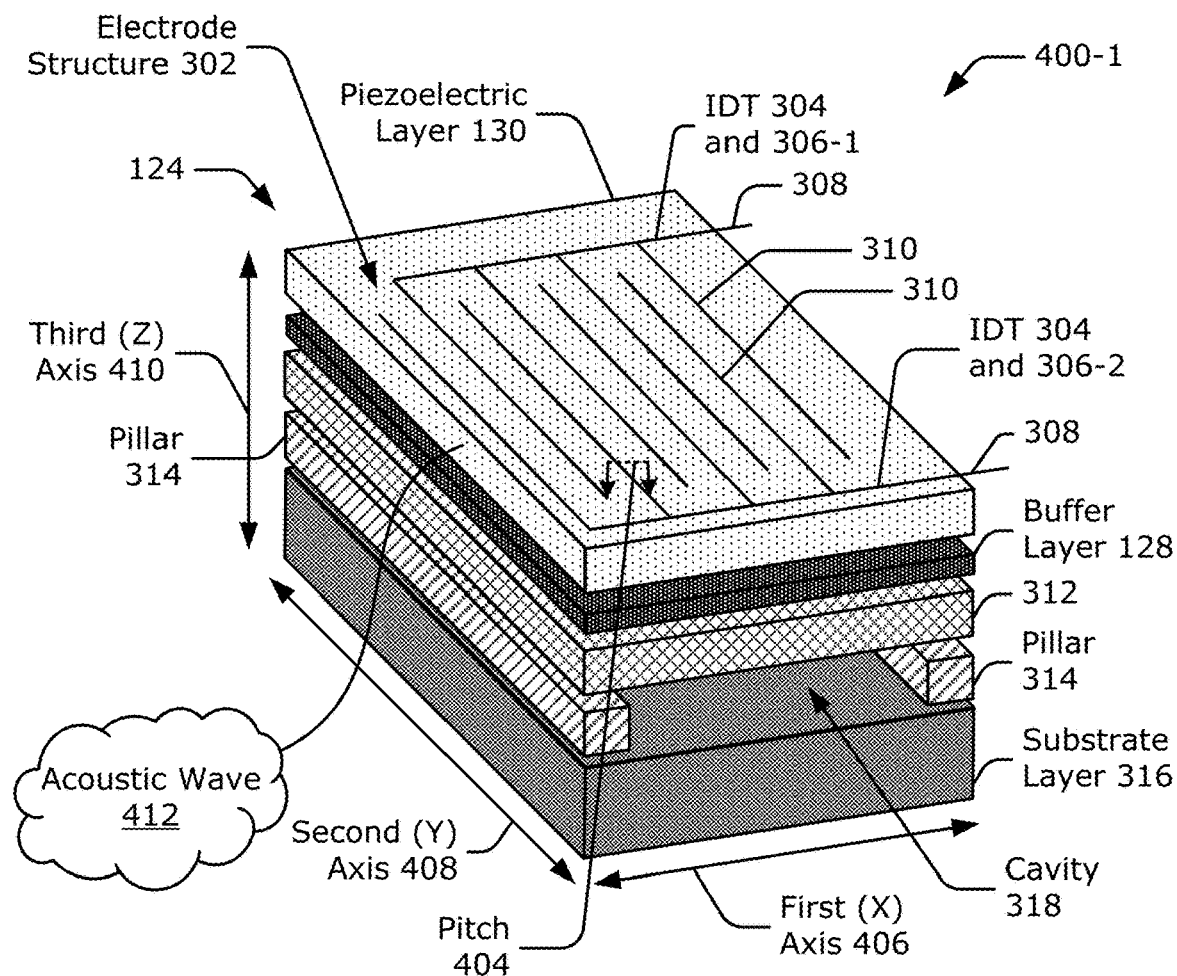
FIG. 4 illustrates an example implementation of a microacoustic filter with a cavity stack.
Figure 4:
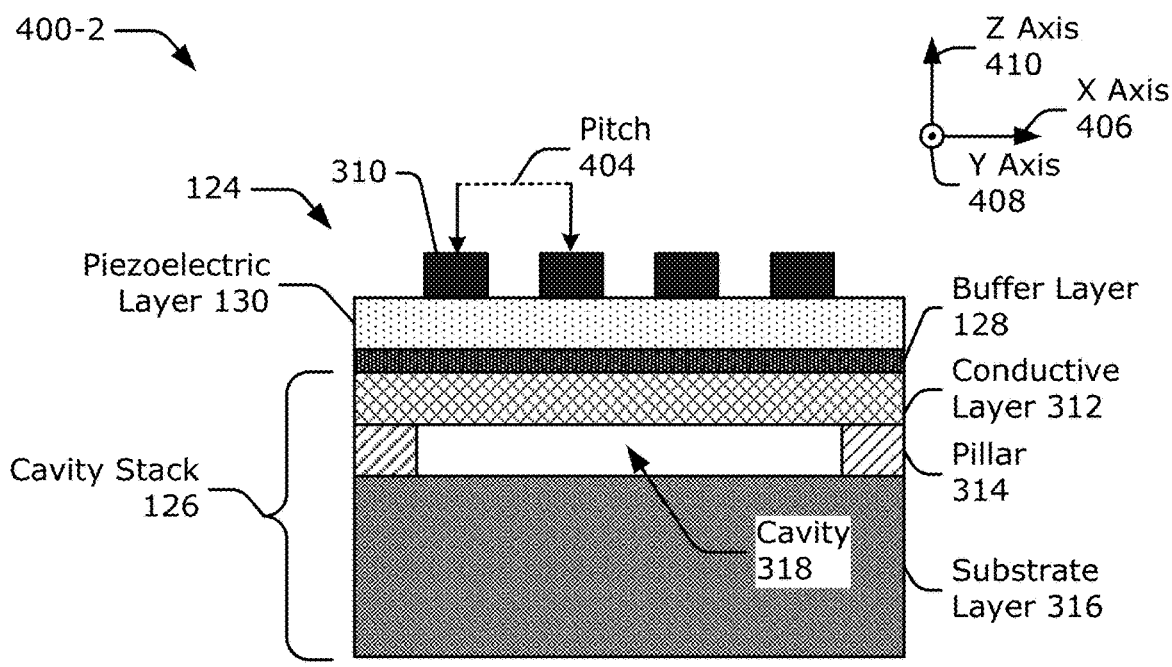

FIG. 4 illustrates an example implementation of the microacoustic filter 124 with the cavity stack 126. A three-dimensional perspective view 400-1 of the microacoustic filter 124 is shown at the top of FIG. 4, and a two-dimensional cross-section view 400-2 of the microacoustic filter 124 is shown at the bottom of FIG. 4. The microacoustic filter 124 includes the electrode structure 302, the piezoelectric layer 130, the buffer layer 128, and the cavity stack 126. The electrode structure 302 can include one or more interdigital transducers 304.

In the depicted configuration shown in the two-dimensional cross-section view 400-2, buffer layer 128 is disposed between the piezoelectric layer 130 and the cavity stack 126. The piezoelectric layer 130 is disposed between the electrode structure 302 and the buffer layer 128. The conductive layer 312 of the cavity stack 126 is disposed between the buffer layer 128 and the pillars 314. The pillars 314 are disposed between the substrate layer 316 and the conductive layer 312. In particular, the pillars 314 extend past a plane defined by a surface of the substrate layer 316 and towards the conductive layer 312 to form the cavity 318 between the substrate layer 316 and the conductive layer 312.

In the three-dimensional perspective view 400-1, the interdigital transducer 304 is shown to have the two comb-shaped structures 306-1 and 306-2 with fingers 310 extending from two busbars 308 towards each other. The fingers 310 are arranged in an interlocking manner in between the two busbars 308 of the interdigital transducer 304 (e.g., arranged in an interdigitated manner). In other words, the fingers 310 connected to a first busbar 308 extend towards a second busbar 308 but do not connect to the second busbar

308. Likewise, fingers 310 connected to the second busbar 308 extend towards the first busbar 308 but do not connect to the first busbar 308.

In the direction along the busbars 308, there is an overlap region including a central region where a portion of one finger 310 overlaps with a portion of an adjacent finger 310. This central region, including the overlap, may be referred to as the aperture, track, or active region where electric fields are produced between fingers 310 to cause an acoustic wave 412 to form at least in this region of the piezoelectric layer 130.

A physical periodicity of the fingers 310 is referred to as a pitch 404 of the interdigital transducer 304. The pitch 404 may be indicated in various ways. For example, in certain aspects, the pitch 404 may correspond to a magnitude of a distance between adjacent fingers 310 of the interdigital transducer 304 in the central region. This distance may be defined, for example, as the distance between center points of each of the fingers 310. The distance may be generally measured between a right (or left) edge of one finger 310 and the right (or left) edge of an adjacent finger 310 when the fingers 310 have uniform widths. In certain aspects, an average of distances between adjacent fingers 310 of the interdigital transducer 304 may be used for the pitch 404. The frequency is determined at least in part by properties of the microacoustic filter 124.

In the three-dimensional perspective view 400-1, the microacoustic filter 124 is defined by a first (X) axis 406, a second (Y) axis 408, and a third (Z) axis 410. The first axis 406 and the second axis 408 are parallel to a planar surface of the piezoelectric layer 130, and the second axis 408 is perpendicular to the first axis 406. The third axis 410 is normal (e.g., perpendicular) to the planar surface of the piezoelectric layer 130. The busbars 308 of the interdigital transducer 304 are oriented to be parallel to the first axis 406. The fingers 310 of the interdigital transducer 304 are orientated to be parallel to the second axis 408. The fingers 310 generate an electric field in a direction that is substantially parallel to the first axis 406. This electric field can generate a quasi-stationary acoustic wave 412, which is trapped within the piezoelectric layer 130, the buffer layer 128, and the conductive layer 312 and is present between adjacent fingers 310 of the electrode structure 302.

As shown in FIG. 4, each of the pillars 314 can extend in a continuous manner across the second (Y) axis 408. Other implementations can implement each pillar 314 in a segmented manner across the second (Y) axis 408. In other words, each pillar 314 can be implemented using multiple pillars that are arranged along the second (Y) axis 408 at a similar point on the first (X) axis 406. In general, the pillars 314 are positioned such that a width of the cavity 318 along the first (X) axis 406 can be approximately equal to or greater than a distance between a first and last finger 310 of the interdigital transducer 304.

During operation, the microacoustic filter 124 accepts a radio-frequency signal, such as the pre-filter transmit signal 224 or the pre-filter receive signal 230 shown in FIG. 2. The electrode structure 302 excites an acoustic wave 412 within the piezoelectric layer 130 using the inverse piezoelectric effect. For example, the interdigital transducer 304 in the electrode structure 302 generates an alternating electric field based on the accepted radio-frequency signal. The piezoelectric layer 130 enables the acoustic wave 412 to be formed in response to the alternating electric field generated by the interdigital transducer 304. In other words, the piezoelectric layer 130 causes, at least partially, the acoustic wave 412 to form responsive to electrical stimulation by one or more interdigital transducers 304.

The acoustic wave 412 forms within the piezoelectric layer 130, the buffer layer 128, and the conductive layer 312 and interacts with the interdigital transducer 304. The acoustic wave 412 that forms can be a standing wave. In some implementations, two reflectors within the electrode structure 302 cause the acoustic wave 412 to be formed as a standing wave across a portion of the first (X) axis 406.

Using the piezoelectric effect, the electrode structure 302 generates a filtered radio-frequency signal based on the formed acoustic wave 412. In particular, the piezoelectric layer 130 generates an alternating electric field due to the mechanical stress generated by the formation of the acoustic wave 412. The alternating electric field induces an alternating current in the other interdigital transducer or the interdigital transducer 304. This alternating current forms the filtered radio-frequency signal, which is provided at an output of the microacoustic filter 124. The filtered radio-frequency signal can include the filtered transmit signal 226 or the filtered receive signal 232 of FIG. 2.

It should be appreciated that while a certain number of fingers are illustrated in FIG. 4, the number of actual fingers and lengths and width of the fingers and busbars may be different in an actual implementation. Such parameters depend on the particular application and desired filter characteristics. In addition, the microacoustic filter 124 can include multiple interconnected electrode structures 302 each including multiple interdigital transducers 304 to achieve a desired passband (e.g., multiple interconnected resonators or interdigital transducers 304 in series or parallel connections to form a desired filter transfer function).

Although not explicitly shown, the electrode structure 302 can also include two or more reflectors. In an example implementation, the interdigital transducer 304 is arranged between two reflectors (not shown). Each reflector within the electrode structure 302 can have two busbars and a grating structure of conductive fingers that each connect to both busbars. In some implementations, the pitch of the reflector can be similar to or the same as the pitch 404 of the interdigital transducer 304. Some implementations of the microacoustic filter 124 can include one or more compensation layers 320, as further described with respect to FIG. 5.

FIG. 5 illustrates example compensation layers 320 of the microacoustic filter 124. In the depicted configuration, the microacoustic filter 124 includes a first compensation layer 320-1, a second compensation layer 320-2, and/or a third compensation layer 320-3. The first compensation layer 320-1 is disposed across the fingers 310 of the electrode structure 302. Because a surface of the first compensation layer 320-1 is exposed within the layer stack of the microacoustic filter 124, it can be relatively easy to trim a thickness of the first compensation layer 320-1 to achieve a desired temperature coefficient of frequency.

The second compensation layer 320-2 is disposed between the electrode structure 302 and the piezoelectric layer 130. A thickness of the second compensation layer 320-2 can be designed to enable the microacoustic filter 124 to achieve a target electromechanical coupling factor for some applications.

The third compensation layer 320-3 is disposed between the conductive layer 312 and the cavity 318. A length of the third compensation layer 320-3 across the first (X) axis 408 can extend between the pillars 314, as shown in FIG. 5. Alternatively, the third compensation layer 320-3 can have a length along the first (X) axis 408 that is less than a distance between the pillars 314. Although the microacoustic filter 124 of FIG. 5 is shown to include three compensation layers 320, other implementations of the microacoustic filter 124 can include only the first compensation layer 320-1, only the second compensation layer 320-2, only the third compensation layer 320-3, or some combination thereof.

FIG. 6 is a flow diagram illustrating an example process 600 for manufacturing a microacoustic filter 124 with a cavity stack 126. The process 600 is described in the form of a set of blocks 602-606 that specify operations that can be performed. However, operations are not necessarily limited to the order shown in FIG. 6 or described herein, for the operations may be implemented in alternative orders or in fully or partially overlapping manners. Also, more, fewer, and/or different operations may be implemented to perform the process 600, or an alternative process. Operations represented by the illustrated blocks of the process 600 may be performed to manufacture the microacoustic filter 124 (e.g., of FIGS. 1 to 3). More specifically, the operations of the process 600 may be performed, at least in part, to manufacture a piezoelectric layer 130 of the microacoustic filter 124 (e.g., of FIGS. 4 and 5) using aluminium scandium nitride 134.

At 602, a cavity stack comprising a conductive layer, a substrate layer, and at least two pillars extending past a plane defined by a surface of the substrate layer and towards the conductive layer to form a cavity between the substrate layer and the conductive layer is provided. For example, the manufacturing process provides the cavity stack 126, as shown in FIG. 3 or 4. The cavity stack 126 includes the conductive layer 312, which can be formed using a single crystal material (e.g., a non-amorphous material) and have a resistivity that is less than approximately 0.1 Ω·cm (e.g., a conductivity that is greater than approximately 10 S/cm). The conductive layer 312 represents a membrane layer of the cavity stack 126. The cavity stack 126 also includes the substrate layer 316 and the pillars 314. The substrate layer 316 can be formed using silicon and the pillars 314 can be formed using silicon dioxide.

The pillars 314 suspend the conductive layer 312 "above" the substrate layer 316 to form a cavity 318. In particular, the pillars 314 extend past a plane defined by a surface of the substrate layer 316 and towards the conductive layer 312 to form the cavity 318 between the substrate layer 316 and the conductive layer 312.

At 604, a buffer layer is disposed on a surface of the conductive layer. For example, the manufacturing process disposes the buffer layer 128 on the surface of the conductive layer 312, as shown in FIGS. 4 and 5. The buffer layer 128 can be implemented using a variety of different materials. In general, the buffer layer 128 enables epitaxial growth of a material that forms the piezoelectric layer 130.

At 606, a piezoelectric layer 130 is disposed on a surface of the buffer layer using epitaxy. For example, the manufacturing processes disposes the piezoelectric layer 130 on the surface of the buffer layer 128 using epitaxy. In some implementations, the piezoelectric layer 130 is formed using aluminium scandium nitride 134. The piezoelectric layer 130 can have a crystalline structure that excites a main wave mode (e.g., the plate mode 136) having an orientation along the third (Z) axis 410. By using epitaxy and materials such as aluminium scandium nitride 134, the cost of manufacturing the microacoustic filter 124 can be less compared to other types of filters that rely on a layer-removal process or a transfer process and utilize piezoelectric materials such as lithium niobate or lithium tantalate. Although not explicitly shown in FIG. 6, the manufacturing process can also include depositing the electrode structure 302 on the piezoelectric layer 130.

There are various processes for manufacturing the microacoustic filter 124. In one process, the cavity stack 126 is commercially available and the buffer layer 128 and the piezoelectric layer 130 are disposed on the cavity stack 126 using a sputtering process. In another process, the cavity stack 126 is manufactured using a Bosch process to form the cavity 318. Some processes can include depositing a passivation layer and/or depositing one or more compensation layers 320.

Although the techniques for implementing a microacoustic filter 124 are described with respect to using aluminium scandium nitride 134 for the piezoelectric layer 130, other implementations are also possible. For example, these techniques can be applied to manufacturing other microacoustic filters 124 using aluminium nitride (AlN) for the piezoelectric layer 130. The aluminium nitride can have a same or similar crystal-axis orientation as the aluminium scandium nitride 134.

Some aspects are described below.

Aspect 1: An apparatus comprising:
  a microacoustic filter comprising:
    an electrode structure;
    a cavity stack comprising:
      a conductive layer;
      a substrate layer; and
      at least two pillars extending past a plane defined by a surface of the substrate layer and towards the conductive layer to form a cavity between the substrate layer and the conductive layer;
    a buffer layer disposed between the conductive layer of the cavity stack and the electrode structure; and a piezoelectric layer disposed between the buffer layer and the electrode structure.

Aspect 2: The apparatus of aspect 1, wherein the microacoustic filter is configured to excite a plate mode in the piezoelectric layer.

Aspect 3: The apparatus of aspect 1 or 2, wherein the piezoelectric layer comprises aluminium scandium nitride (AlScN).

Aspect 4: The apparatus of any previous aspect, wherein the conductive layer has a resistivity that is less than approximately 0.1 ohm centimeter.

Aspect 5: The apparatus of any previous aspect, wherein the conductive layer comprises doped silicon (Si).

Aspect 6: The apparatus of aspect 5, wherein the doped silicon (Si) has a doping concentration that is greater than approximately $10^{18}$ atoms per cubic centimeter.

Aspect 7: The apparatus of any previous aspect, wherein the conductive layer and the buffer layer are jointly configured to enable epitaxial growth of the piezoelectric layer.

Aspect 8: The apparatus of any previous aspect, wherein the conductive layer comprises a single crystal material.

Aspect 9: The apparatus of aspect 8, wherein the single crystal material comprises silicon having Miller indices of (1 1 1).

Aspect 10: The apparatus of any previous aspect, wherein the buffer layer comprises at least one of the following materials:
  aluminium (Al) or aluminium nitride (AlN);
  gallium (Ga) or gallium nitride (GaN);
  hafnium (Hf) or hafnium nitride (HfN);
  molybdenum (Mo) or molybdenum nitride (MoN);
  niobium (Nb) or niobium nitride (NbN);
  silicon carbide (SiC);

scandium (Sc) or scandium nitride (ScN);
titanium (Ti) or titanium nitride (TiN);
zinc (Zi) or zinc oxide (ZnO); or
zirconium (Zr) or zirconium nitride (ZrN).

Aspect 11: The apparatus of any previous aspect, wherein:
the electrode structure comprises multiple fingers arranged across a plane having a first axis that is perpendicular to the multiple fingers and a second axis that is parallel to the multiple fingers; and
the multiple fingers are positioned between the at least two pillars along the first axis.

Aspect 12: The apparatus of any previous aspect, wherein the microacoustic filter comprises at least one of the following:
a first compensation layer disposed on the electrode structure;
a second compensation layer disposed between the electrode structure and the piezoelectric layer; or
a third compensation layer disposed between the conductive layer and the cavity.

Aspect 13: The apparatus of aspect 12, wherein the first compensation layer, the second compensation layer, or the third compensation layer comprises silicon dioxide ($SiO_2$) or doped silicon dioxide.

Aspect 14: The apparatus of any previous aspect, wherein:
the microacoustic filter comprises multiple cascaded resonators; and
a resonator of the multiple cascaded resonators comprises the cavity stack, the piezoelectric layer, and the buffer layer.

Aspect 15: The apparatus of any previous aspect, further comprising:
a wireless transceiver coupled to at least one antenna, the wireless transceiver comprising the microacoustic filter and configured to filter, using the microacoustic filter, a wireless signal communicated via the at least one antenna.

Aspect 16: The apparatus of any previous aspect, wherein the microacoustic filter is configured to have a resonant frequency between approximately 500 megahertz and 2.6 gigahertz.

Aspect 17: The apparatus of aspect 16, wherein:
a thickness of the conductive layer is between approximately 0.5 and 5 micrometers; and
a thickness of the piezoelectric layer is between approximately 0.5 and 5 micrometers.

Aspect 18: The apparatus of aspect 17, wherein the thickness of the conductive layer and the thickness of the piezoelectric layer are approximately equal.

Aspect 19: The apparatus of aspect 17, wherein a thickness of the buffer layer is less than the thickness of the piezoelectric layer.

Aspect 20: An apparatus comprising:
a microacoustic filter configured to generate a filtered signal from a radio-frequency signal, the microacoustic filter comprising:
means for converting the radio-frequency signal to an acoustic wave and converting a formed acoustic wave into the filtered signal;
means for exciting a plate mode using a piezoelectric layer to produce the formed acoustic wave;
means for enabling epitaxial growth of the piezoelectric layer; and
means for confining energy of the plate mode within the means for exciting the plate mode and the means for enabling epitaxial growth.

Aspect 21: The apparatus of aspect 20, wherein:
the microacoustic filter comprises a substrate layer; and
the means for confining energy of the plate mode comprises means for suspending the means for enabling epitaxial growth apart from the substrate layer.

Aspect 22: A method of manufacturing a microacoustic filter, the method comprising:
providing a cavity stack comprising a conductive layer, a substrate layer, and at least two pillars extending past a plane defined by a surface of the substrate layer and towards the conductive layer to form a cavity between the substrate layer and the conductive layer;
disposing a buffer layer on a surface of the conductive layer; and
disposing a piezoelectric layer on a surface of the buffer layer using epitaxy.

Aspect 23: The method of aspect 22, wherein the conductive layer comprises a single crystal material.

Aspect 24: The method of aspect 22 or 23, wherein the conductive layer comprises doped silicon (Si) having a doping concentration that is greater than approximately $10^{18}$ atoms per cubic centimeter.

Aspect 25: The method of any one of aspects 22-24, wherein the buffer layer comprises at least one of the following materials:
aluminium (Al) or aluminium nitride (AlN);
gallium (Ga) or gallium nitride (GaN);
hafnium (Hf) or hafnium nitride (HfN);
molybdenum (Mo) or molybdenum nitride (MoN);
niobium (Nb) or niobium nitride (NbN);
silicon carbide (SiC);
scandium (Sc) or scandium nitride (ScN);
titanium (Ti) or titanium nitride (TiN);
zinc (Zi) or zinc oxide (ZnO); or
zirconium (Zr) or zirconium nitride (ZrN).

Aspect 26: A piezoelectric apparatus comprising:
an electrode structure;
a buffer layer configured to enable epitaxial growth of aluminium scandium nitride (AlScN); and
a piezoelectric layer disposed between the buffer layer and the electrode structure, the piezoelectric layer comprising the aluminium scandium nitride (AlScN) having a crystal-axis orientation that is approximately normal to a planar surface of the piezoelectric layer.

Aspect 27: The piezoelectric apparatus of aspect 26, wherein the piezoelectric layer is configured to excite a plate mode.

Aspect 28: The piezoelectric apparatus of aspect 26 or 27, further comprising:
a cavity stack,
wherein the buffer layer is disposed between the cavity stack and the piezoelectric layer.

Aspect 29: The piezoelectric apparatus of aspect 28, wherein the cavity stack comprises:
a conductive layer;
a substrate layer; and
at least two pillars extending past a plane defined by a surface of the substrate layer and towards the conductive layer to form a cavity between the substrate layer and the conductive layer.

Aspect 30: The piezoelectric apparatus of aspect 29, wherein:
the conductive layer comprises doped silicon (Si);
the substrate layer comprises silicon (Si); and
the at least two pillars comprise silicon dioxide ($SiO_2$).

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a microacoustic filter comprising:
        an electrode structure;
        a cavity stack comprising:
            a conductive layer comprising doped silicon (Si);
            a substrate layer; and
            at least two pillars extending past a plane defined by a surface of the substrate layer and towards the conductive layer to form a cavity between the substrate layer and the conductive layer;
        a buffer layer disposed between the conductive layer of the cavity stack and the electrode structure; and
        a piezoelectric layer disposed between the buffer layer and the electrode structure.

2. The apparatus of claim 1, wherein the microacoustic filter is configured to excite a plate mode in the piezoelectric layer.

3. The apparatus of claim 1, wherein the piezoelectric layer comprises aluminium scandium nitride (AlScN).

4. The apparatus of claim 1, wherein the conductive layer has a resistivity that is less than approximately 0.1 ohm centimeter.

5. The apparatus of claim 1, further comprising:
    a wireless transceiver coupled to at least one antenna, the wireless transceiver comprising the microacoustic filter and configured to filter, using the microacoustic filter, a wireless signal communicated via the at least one antenna.

6. The apparatus of claim 1, wherein the doped silicon (Si) has a doping concentration that is greater than approximately $10^{18}$ atoms per cubic centimeter.

7. The apparatus of claim 1, wherein the conductive layer and the buffer layer are jointly configured to enable epitaxial growth of the piezoelectric layer.

8. The apparatus of claim 1, wherein the doped silicon comprises a single crystal material.

9. The apparatus of claim 1, wherein the doped silicon has Miller indices of (1 1 1).

10. The apparatus of claim 1, wherein the buffer layer comprises at least one of the following materials:
    aluminium (Al) or aluminium nitride (AlN);
    gallium (Ga) or gallium nitride (GaN);
    hafnium (Hf) or hafnium nitride (HfN);
    molybdenum (Mo) or molybdenum nitride (MoN);
    niobium (Nb) or niobium nitride (NbN);
    silicon carbide (SiC);
    scandium (Sc) or scandium nitride (ScN);
    titanium (Ti) or titanium nitride (TiN);
    zinc (Zi) or zinc oxide (ZnO); or
    zirconium (Zr) or zirconium nitride (ZrN).

11. The apparatus of claim 1, wherein:
    the electrode structure comprises multiple fingers arranged across a plane having a first axis that is perpendicular to the multiple fingers and a second axis that is parallel to the multiple fingers; and
    the multiple fingers are positioned between the at least two pillars along the first axis.

12. The apparatus of claim 1, wherein the microacoustic filter comprises at least one of the following:
    a first compensation layer disposed on the electrode structure;
    a second compensation layer disposed between the electrode structure and the piezoelectric layer; or
    a third compensation layer disposed between the conductive layer and the cavity.

13. The apparatus of claim 12, wherein the first compensation layer, the second compensation layer, or the third compensation layer comprises silicon dioxide ($SiO_2$) or doped silicon dioxide.

14. The apparatus of claim 1, wherein:
    the microacoustic filter comprises multiple cascaded resonators; and
    a resonator of the multiple cascaded resonators comprises the cavity stack, the piezoelectric layer, and the buffer layer.

15. The apparatus of claim 1, wherein the microacoustic filter is configured to have a resonant frequency between approximately 500 megahertz and 2.6 gigahertz.

16. The apparatus of claim 15, wherein:
    a thickness of the conductive layer is between approximately 0.5 and 5 micrometers; and
    a thickness of the piezoelectric layer is between approximately 0.5 and 5 micrometers.

17. The apparatus of claim 16, wherein a thickness of the buffer layer is less than the thickness of the piezoelectric layer.

18. The apparatus of claim 16, wherein the thickness of the conductive layer and the thickness of the piezoelectric layer are approximately equal.

19. An apparatus comprising:
    a microacoustic filter configured to generate a filtered signal from a radio-frequency signal, the microacoustic filter comprising:
        means for converting the radio-frequency signal to an acoustic wave and converting a formed acoustic wave into the filtered signal;
        means for exciting a plate mode using a piezoelectric layer to produce the formed acoustic wave;
        means for enabling epitaxial growth of the piezoelectric layer; and
        means for confining energy of the plate mode within the means for exciting the plate mode and the means for enabling epitaxial growth, the means for confining energy comprising a conductive layer comprising a single crystal material.

20. The apparatus of claim 19, wherein:
    the microacoustic filter comprises a substrate layer; and
    the means for confining energy of the plate mode comprises means for suspending the means for enabling epitaxial growth apart from the substrate layer.

21. A method of manufacturing a microacoustic filter, the method comprising:
- providing a cavity stack comprising a conductive layer that comprises a single crystal material, a substrate layer, and at least two pillars extending past a plane defined by a surface of the substrate layer and towards the conductive layer to form a cavity between the substrate layer and the conductive layer;
- disposing a buffer layer on a surface of the conductive layer; and
- disposing a piezoelectric layer on a surface of the buffer layer using epitaxy.

22. The method of claim 21, wherein the conductive layer comprises doped silicon (Si) having a doping concentration that is greater than approximately $10^{18}$ atoms per cubic centimeter.

23. The method of claim 21, wherein the buffer layer comprises at least one of the following materials:
- aluminium (Al) or aluminium nitride (AlN);
- gallium (Ga) or gallium nitride (GaN);
- hafnium (Hf) or hafnium nitride (HfN);
- molybdenum (Mo) or molybdenum nitride (MoN);
- niobium (Nb) or niobium nitride (NbN);
- silicon carbide (SiC);
- scandium (Sc) or scandium nitride (ScN);
- titanium (Ti) or titanium nitride (TiN);
- zinc (Zi) or zinc oxide (ZnO); or
- zirconium (Zr) or zirconium nitride (ZrN).

24. A piezoelectric apparatus comprising:
- an electrode structure;
- a buffer layer configured to enable epitaxial growth of aluminium scandium nitride (AlScN);
- a piezoelectric layer disposed between the buffer layer and the electrode structure, the piezoelectric layer comprising the aluminium scandium nitride (AlScN) having a crystal-axis orientation that is approximately normal to a planar surface of the piezoelectric layer; and
- a cavity stack comprising:
  - a conductive layer comprising doped silicon (Si);
  - a substrate layer comprising silicon (Si); and
  - at least two pillars comprising silicon dioxide ($SiO_2$) and extending past a plane defined by a surface of the substrate layer and towards the conductive layer to form a cavity between the substrate layer and the conductive layer, wherein the buffer layer is disposed between the cavity stack and the piezoelectric layer.

25. The piezoelectric apparatus of claim 24, wherein the piezoelectric layer is configured to excite a plate mode.

* * * * *